United States Patent
Park et al.

(10) Patent No.: US 7,518,181 B2
(45) Date of Patent: Apr. 14, 2009

(54) SEMICONDUCTOR MEMORY DEVICE AND METHODS OF MANUFACTURING AND OPERATING THE SAME

(75) Inventors: Yoon-Dong Park, Yongin-si (KR); Suk-Pil Kim, Yongin-si (KR); Won-Joo Kim, Hwaseong-si (KR)

(73) Assignee: Samsung Electronics Co., Ltd., Gyeonggido (KR)

( * ) Notice: Subject to any disclaimer, the term of this patent is extended or adjusted under 35 U.S.C. 154(b) by 2 days.

(21) Appl. No.: 11/723,490

(22) Filed: Mar. 20, 2007

(65) Prior Publication Data

US 2007/0222036 A1  Sep. 27, 2007

(30) Foreign Application Priority Data

Mar. 24, 2006  (KR) ................... 10-2006-0027062

(51) Int. Cl.
*H01L 29/792* (2006.01)

(52) U.S. Cl. .................. 257/324; 257/353; 257/311; 257/E29.275; 438/216; 365/185.26

(58) Field of Classification Search ........... 257/324, 257/E29.275
See application file for complete search history.

(56) References Cited

U.S. PATENT DOCUMENTS

| 6,664,582 | B2 | 12/2003 | Fried et al. |
| 6,876,042 | B1 | 4/2005 | Yu et al. |
| 2005/0124120 | A1* | 6/2005 | Du et al. ............... 438/283 |
| 2006/0001058 | A1* | 1/2006 | Dreeskornfeld et al. ..... 257/288 |

* cited by examiner

*Primary Examiner*—Tu-Tu V Ho
(74) *Attorney, Agent, or Firm*—Harness, Dickey & Pierce PLC (57) ABSTRACT

A semiconductor memory device and methods of manufacturing and operating the same may be provided. The semiconductor memory device may include a substrate, at least a pair of fins protruding from the semiconductor substrate and facing each other with a gap between fins of the pair of fins, an insulating layer formed between the pair of the fins, a storage node formed on the pair of fins and/or a surface of a portion of the insulating layer, and/or a gate electrode formed on the storage node.

8 Claims, 12 Drawing Sheets

SEMICONDUCTOR MEMORY DEVICE AND METHODS OF MANUFACTURING AND OPERATING THE SAME

PRIORITY STATEMENT

This application claims the benefit of priority to Korean Patent Application No. 10-2006-00027062, filed on Mar. 24, 2006, in the Korean Intellectual Property Office, the entire contents of which is incorporated herein in its entirety by reference.

BACKGROUND

1. Field

Example embodiments relate to a semiconductor memory device, and for example, to a semiconductor device and a random access memory (RAM) including fin-type channel regions. For example, the semiconductor device may include a fin field effect transistor (FinFET), and the RAM may include a dynamic random access memory (DRAM), a resistance random access memory (RRAM), a ferroelectric random access memory (FeRAM), or an NOR-type flash memory.

2. Description of Related Art

Fin field effect transistor (FinFET) structures which may enhance the performance of semiconductor devices have been studied.

FinFETs may use upper and/or side surfaces of a fin as a channel region. FinFETs may have a larger channel region than flat transistors, thereby allowing a greater current flow. Accordingly, FinFETs may perform better than flat transistors.

However, because conventional FinFETs may be manufactured using a silicon on insulator (SOI) substrate, a fin may float on a body of the SOI substrate. Accordingly, a threshold voltage of a transistor may not be controlled using a body bias, which may make it difficult to control a threshold voltage of a CMOS transistor. If the FinFETs are manufactured using a conventional bulk substrate, a drain depletion region may be expanded, thereby increasing junction leakage current, off-current, and/or junction capacitance. For example, a threshold voltage may be reduced and off current may be increased due to a short-channel effect in highly integrated semiconductor devices.

FinFETs may have higher contact resistance. For example, a conventional FinFET may include a plurality of bitline contacts crossing a plurality of fins. For example, the narrow upper surfaces of the bitline contacts and fins may contact one another. Accordingly, bitline contact resistance may be higher, and the fins may be bent to form the bitline contacts, thereby increasing manufacturing difficulty.

In a conventional FinFET, source and drain regions may be connected to fins and may be formed to secure a contact area. However, the distance between the fins may become greater due to the source and drain regions, which may reduce the integration density of the FinFET.

SUMMARY

Example embodiments may provide a higher-performance semiconductor device which may control a body-bias, adopt advantages of a silicon-on-insulator (SOI) structure, and/or provide a higher operating current and/or lower contact resistance.

Example embodiments may provide a method of manufacturing the semiconductor device.

Example embodiments may provide a method of operating the semiconductor device.

According to an example embodiment, a semiconductor memory device may include a substrate, at least a pair of fins protruding from the semiconductor substrate and facing each other with a gap between fins of the pair of fins, an insulating layer formed between the pair of the fins, a storage node formed on the pair of fins and/or a surface of a portion of the insulating layer, and/or a gate electrode formed on the storage node.

According to an example embodiment, the semiconductor memory device may include a pair of channel regions formed in surfaces of the portions of each pair of fins which contact the storage node, and/or a source and a drain formed in surfaces of each pair of fins on both sides of each of channel region of the pair of channel regions.

According to an example embodiment, widths of the fins in the region where the fins and the storage node contact each other may be smaller than widths of the fins in a region where the source and the drain may be formed.

According to an example embodiment, the semiconductor memory device may further include an oxide layer formed between the semiconductor substrate and the storage node.

According to an example embodiment, the storage node may include polysilicon, silicon-germanium, a metal dot, a silicon dot, or a silicon nitride layer.

According to an example embodiment, the storage node may include a dielectric material, a variable resistance material, a phase change material, or a ferroelectric material.

According to an example embodiment, the semiconductor substrate may include bulk silicon, bulk silicon-germanium, or a silicon or silicon-germanium expitaxial layer on the bulk silicon and/or bulk silicon-germanium layer.

According to an example embodiment, the semiconductor memory device may further include another insulating layer formed between the fins of each pair of fins.

According to an example embodiment, a method of manufacturing a semiconductor memory device may include forming on a semiconductor substrate at least a pair of fins protruding from the semiconductor substrate and facing each other with a gap between fins of the pair of fins, forming a first insulating layer on outer side portions of the pair of fins and/or forming a second insulting layer on inner side portions of the pair of fins, forming a photoresist (PR) layer patterned in a direction in which the pair of fins face each other, forming a hole by removing an exposed portion of the first insulating layer, and/or forming an oxide layer by filing the hole with an oxide, etching the first insulating layer and/or the oxide layer and partially exposing the outer side portions of the pair of fins, and/or forming a storage node and/or a gate electrode on the outer side portions of the pair of fins and/or on a surface of the insulating layer.

According to an example embodiment, forming a storage node and/or a gate electrode on the outer side portions of the pair of fins and//or on a surface of the insulating layer may be done sequentially.

According to an example embodiment, the forming of the first insulating layer and/or the second insulating layer may include forming the first insulating layer by coating an insulating material on the pair of fins, removing the first insulating layer from the upper and inner side portions of the pair of fins, injecting impurities into the upper portions of the pair of fins, and/or forming the second insulating layer on the inner side portions of the pair of fins.

According to an example embodiment, the forming of the first insulating layer and/or the second insulating layer may further include injecting impurities into the inner side portions of the pair of fins.

According to an example embodiment, the forming of the PR layer, the hole, and/or the oxide layer may further include etching inside the hole and increasing a width of the hole.

According to an example embodiment, the first insulating layer may be formed of a silicon oxide, and the second insulating layer may be formed of a silicon nitride.

According to an example embodiment, the gate electrode may be formed of polysilicon, metal, a metal silicide, or a combination of polysilicon metal, metal, and/or a metal silicide.

According to an example embodiment, a method of operating a semiconductor memory device may include applying a turn-on voltage to a gate electrode of the semiconductor memory device to turn on a pair of channel regions of the semiconductor memory device so that a conductive path may be formed, the semiconductor memory device may include a substrate, at least a pair of fins protruding from the substrate and facing each other with a gap between fins of the pair of fins, an insulating layer formed between the pair of fins, a storage node formed on the pair of fins and a surface of a portion of the insulating layer, wherein the pair of channel regions may be formed in surfaces of portions of each pair of fins which contact the storage node, a source and a drain formed in surfaces of each pair of fins on both sides of each of channel region of the pair of channel regions, and wherein the gate electrode may be formed on the storage node, and/or applying an operating voltage between the source and the drain formed in the fins so that current may flow from the drain to the source through the channel regions.

BRIEF DESCRIPTION OF THE DRAWINGS

The above and/or other features and advantages will become more apparent and more readily appreciated from the following detailed description of example embodiments taken in conjunction with the accompanying drawings of which.

DETAILED DESCRIPTION OF EXAMPLE EMBODIMENTS

Example embodiments will now be described more fully with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thickness of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Figure 1:
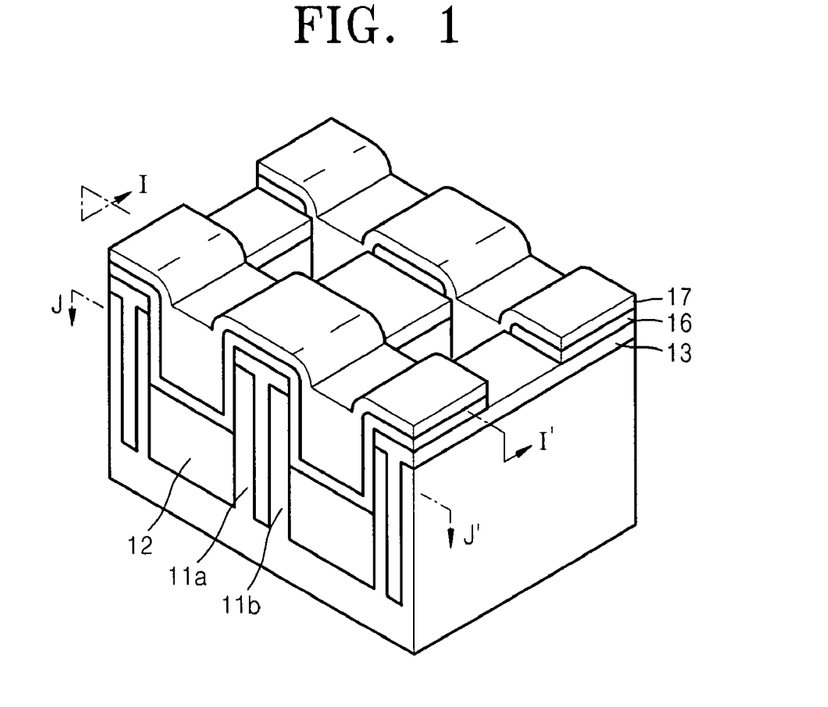
FIG. 1 is a perspective view of a semiconductor memory device according to an example embodiment.
Figure 2A:
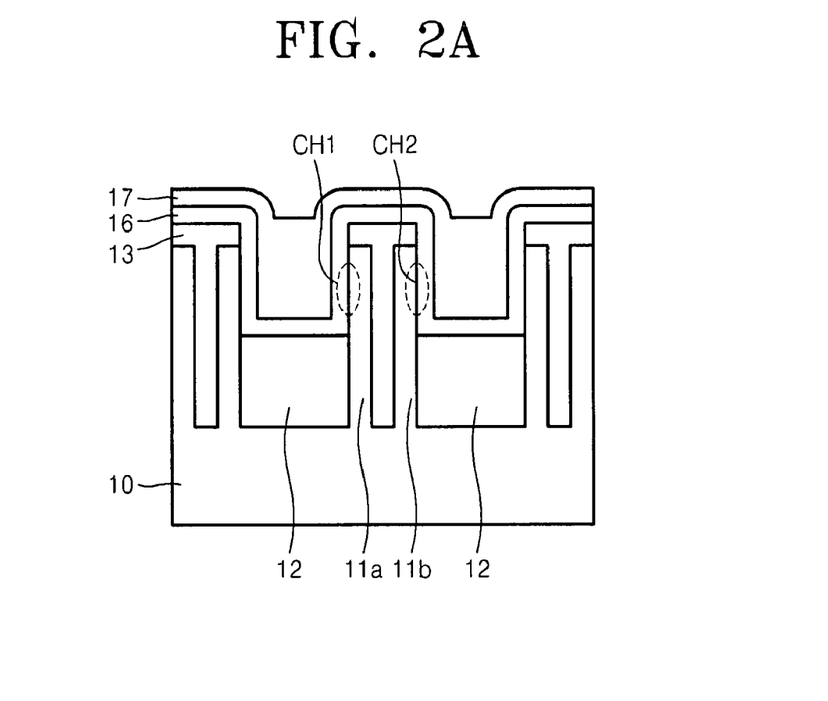
FIG. 2A is a vertical cross-sectional view of the semiconductor memory device taken along a line I-I' of FIG. 1.
Figure 2B:
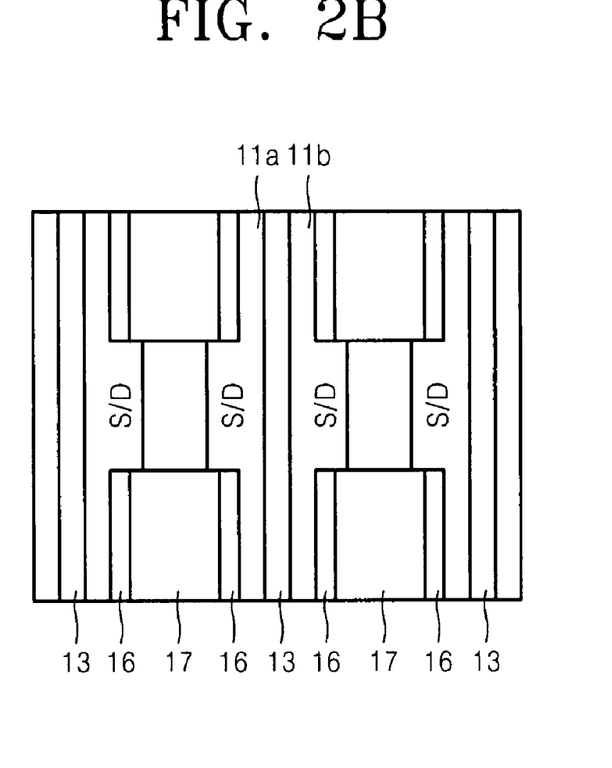
FIG. 2B is a horizontal cross-sectional view of the semiconductor memory device taken along a line J-J' of FIG. 1.

FIG. 1 is a perspective view of a semiconductor memory device according to an example embodiment. FIG. 2A is a vertical cross-sectional view of the semiconductor memory device taken along a line I-I' of FIG. 1. FIG. 2B is a horizontal cross-sectional view of the semiconductor memory device taken along a line J-J' of FIG. 1.

Referring to FIG. 1 and FIGS. 2A and 2B, at least a pair of first and second fins 11a and 11b may be formed on a semiconductor substrate 10, and a first insulating layer 12 may be formed on a portion of the semiconductor substrate 10 between each pair of the first and second fins 11a and 11b. A storage node 16 and/or a gate electrode 17 may be formed on each pair of the first and second fins 11a and 11b and/or the first insulating layer 12. Widths of the first and second fins 11a and 11b in a region where the storage node 16 may be formed may be narrower than widths of the first and second fins 11a and 11b in a region where the storage node 16 may not be formed, for example, a region where a source and a drain may be formed. Accordingly, a depletion region may be limited.

Channel regions CH1 and CH2 may be formed in a region where the storage node 16 may contact the first and second fins 11a and 11b. A source S and a drain D may be formed in a region for a pair of the first and second fins 11a and 11b on both sides of the channel regions CH1 and CH2. Accordingly, semiconductor the memory device according to example embodiments may have a FinFET structure because the channel regions CH1 and CH2 may be formed in the region for the first and second fins 11a and 11b of each pair of fins. The storage node 16 may be selectively formed according to types of memories. For example, in dynamic random access memory (DRAM), the storage node 16 may be formed to have a capacitor structure by coating a dielectric material thereon. In resistance random access memory (RRAM), a transition metal oxide may be coated on the storage node 16. In parameter random access memory (PRAM), a phase change material may be coated on the storage node 16. In ferroelectric random access memory (FeRAM), a ferroelectric material may be coated on the storage node 16. In a SONOS structure, the storage node 16 may have a multi-layer structure composed of an oxide, a nitride, and/or an oxide stacked. For example, in a SONOS structure, the storage node 16 may have a multi-layer structure composed of an oxide, a nitride, and/or an oxide stacked sequentially. The storage node 16 may be formed of polysilicon, silicon-germanium, a metal dot, a silicon dot, or a silicon nitride layer. The storage node 16 may be formed of a dielectric material, a resistance conversion material, a phase change material, or a ferroelectric material.

The semiconductor substrate 10 may be formed of a material used for conventional semiconductor memory devices. For example, the semiconductor substrate 10 may be formed of bulk silicon, bulk silicon-germanium, or a silicon or silicon-germanium expitaxial layer formed on the bulk silicon and/or the bulk silicon-germanium. Each pair of the first and second fins 11a and 11b on the semiconductor substrate 10 may be formed of materials identical to that of the semiconductor substrate 10 or each pair of the first and second fins 11a and 11b may be expitaxial layers formed on the semiconductor substrate 10. A second insulating layer 13 may be formed between the first and second fins 11a and 11b. The first and/or second insulating layers 12 and 13 may be silicon oxide layers, silicon nitride layers or high-k dielectric layers, or a combination of silicon oxide layers, silicon nitride layers, and/or high-k dielectric layers. For manufacturing convenience, the first and second insulating layers 12 and 13 may be formed of different materials. For example, the first insulating layer 12 may be formed of a silicon oxide, and the second insulating layer 13 may be formed of a silicon nitride.

The channel regions CH1 and CH2 may be formed in surfaces of the portions of the first and second fins 11a and 11b of each pair, which may contact the storage node 16, and function as paths through which electric charges move between the source S and the drain D. Referring to the drawings, one gate electrode 17 may be provided with the two channel regions CH1 and CH2 as the paths of electric charges. Because the two channel regions CH1 and CH2 may be used simultaneously, an operating current of the semiconductor memory device may be increased. The operating speed of the semiconductor memory device may be increased. Accordingly, the semiconductor memory device may be used for memories that require higher operating currents, for example PRAMs or RRAMs. When the semiconductor memory device is used for DRAMs, the operating currents of the DRAMs may be increased, which may increase a sensing margin.

At least a pair of the source S and the drain D may be formed in the region of the first and second fins 11a and 11b on both sides of the channel regions CH1 and CH2, for example, at least a pair of the source S and the drain D may be formed on both sides of each of the respective channel regions CH1 and CH2 of the first and second fins 11a and 11b of each pair. The source S and the drain D may not be confined by their names. For example, the source S and the drain D may be interchangeably called according to their functions. The source S and the drain D may form a diode junction in the semiconductor substrate 10 and/or in portions of the first and second fins 11a and 11b excluding the source S and the drain D. For example, when the source S and the drain D are doped with n-type impurities, the portions of the first and second fins 11a and 11b excluding the source S and the drain D and/or the semiconductor substrate 10 may be doped with p-type impurities. For example, when the source S and the drain D are doped with p-type impurities, the portions of the first and second fins 11a and 11b excluding the source S and the drain D and/or the semiconductor substrate 10 may be doped with n-type impurities.

The gate electrode 17 may be formed on the storage node 16 and may be formed of a conductive material. For example, the gate electrode 17 may be formed of polysilicon, metal, a metal silicide, or a combination of polysilicon metal and a metal silicide. As illustrated in example embodiments in the drawings, the gate electrode 17 may correspond to a pair of the channel regions CH1 and CH2. When the gate electrode 17 has an array structure, it may be electrically connected to another unit device by an upper portion of the second insulating layer 13.

Operating characteristics of the semiconductor memory device according to example embodiments will now be described with reference to FIGS. 1, 2A, and 2B.

Referring to FIGS. 1, 2A, and 2B, when a turn-on voltage may be applied to the gate electrode 17, the channel regions CH1 and CH2 may be simultaneously turned on, thereby forming a conductive path. Accordingly, an operating voltage may be applied between the source S and the drain D formed in the fins 11a and 11b, and current may flow from the drain D to the source S via the channel regions CH1 and CH2. For example, a semiconductor device, for example the semiconductor memory device, may provide a FinFET operation.

When the semiconductor device operates, the narrower the widths of the fins 11a and 11b, the more limited the depletion region may become. Accordingly, although the fins 11a and 11b may be connected to the semiconductor substrate 10, the semiconductor substrate 10 may have a structure similar to an SOI structure. Off-current, junction leakage current, and/or junction capacitance, which may be generated due to the expansion of the depletion region, may be reduced. A reduced junction leakage current may improve the sensing margin of a semiconductor device, for example, a memory device, and reduce power consumption. A short channel effect, which may be a problem as the integration density of the semiconductor device increases, may be reduced. However, a body bias can still be applied to the fins 11a and 11b by applying a voltage to the semiconductor substrate 10. Accordingly, a threshold voltage of a semiconductor device, for example, a CMOS FinFET, may be easily controlled. For example, threshold voltages of an NMOS FinFET and a PMOS FinFET may be controlled to a similar level by adjusting body biases of the NMOS FinFET and the PMOS FinFet.

A manufacturing process of a semiconductor memory device according to an example embodiment will now be described in detail with reference to the attached drawings. FIGS. 3A through 3G are plan views for illustrating a manufacturing process of a semiconductor memory device according to an example embodiment.

Figure 3A:
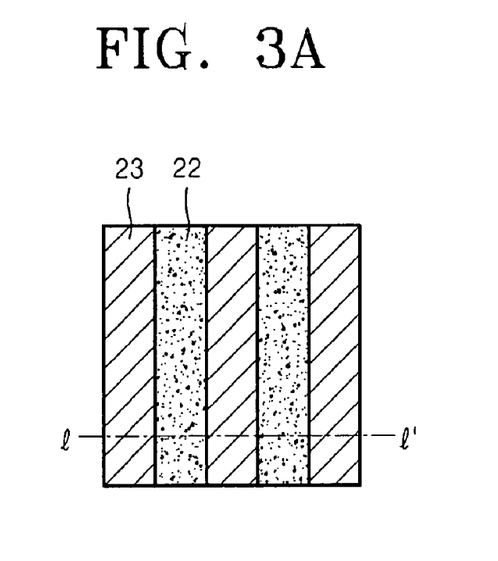
FIGS. 3A through 3G are plan views for illustrating a manufacturing process of a semiconductor memory device according to an example embodiment.
Figure 4A:
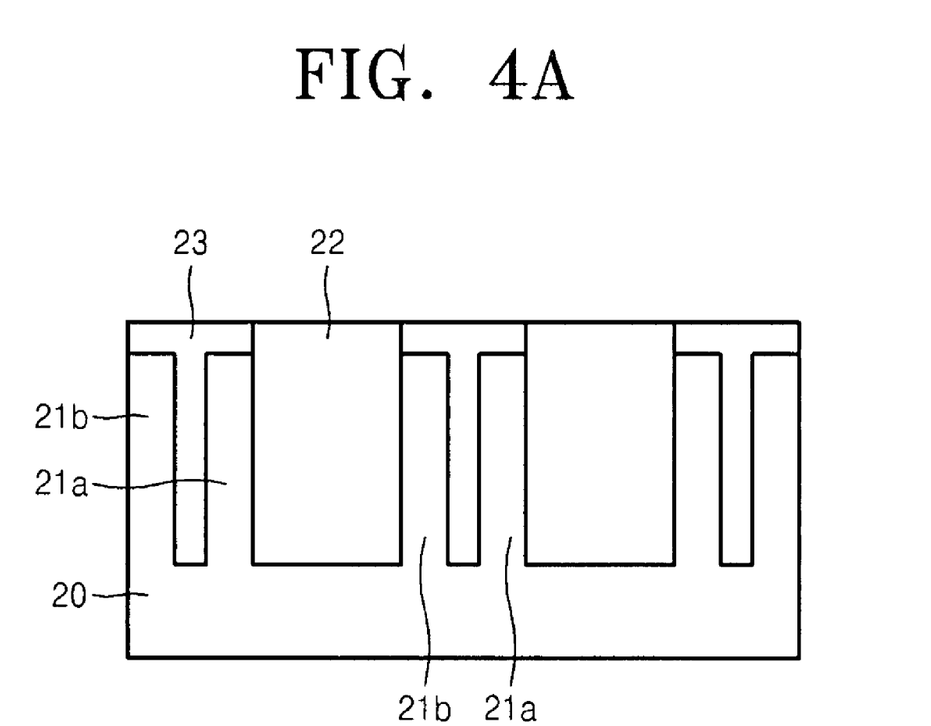
FIG. 4A is a cross-sectional view of the semiconductor memory device taken along a line I-I' of FIG. 3A.

Referring to FIG. 3A, a plurality of first insulating layers 22 and/or a plurality of second insulating layers 23 may be formed in a first direction. FIG. 4A is a cross-sectional view of the semiconductor memory device taken along a line I-I' of FIG. 3A. Referring to FIG. 4A, a semiconductor substrate 20 may include each pair of first and second fins 21a and 21b protruding in an upward direction. The first insulating layers 22 and/or the second insulating layers 23 may be interposed between the first fins 21a and the second fins 21b, respectively.

Figure 4B:
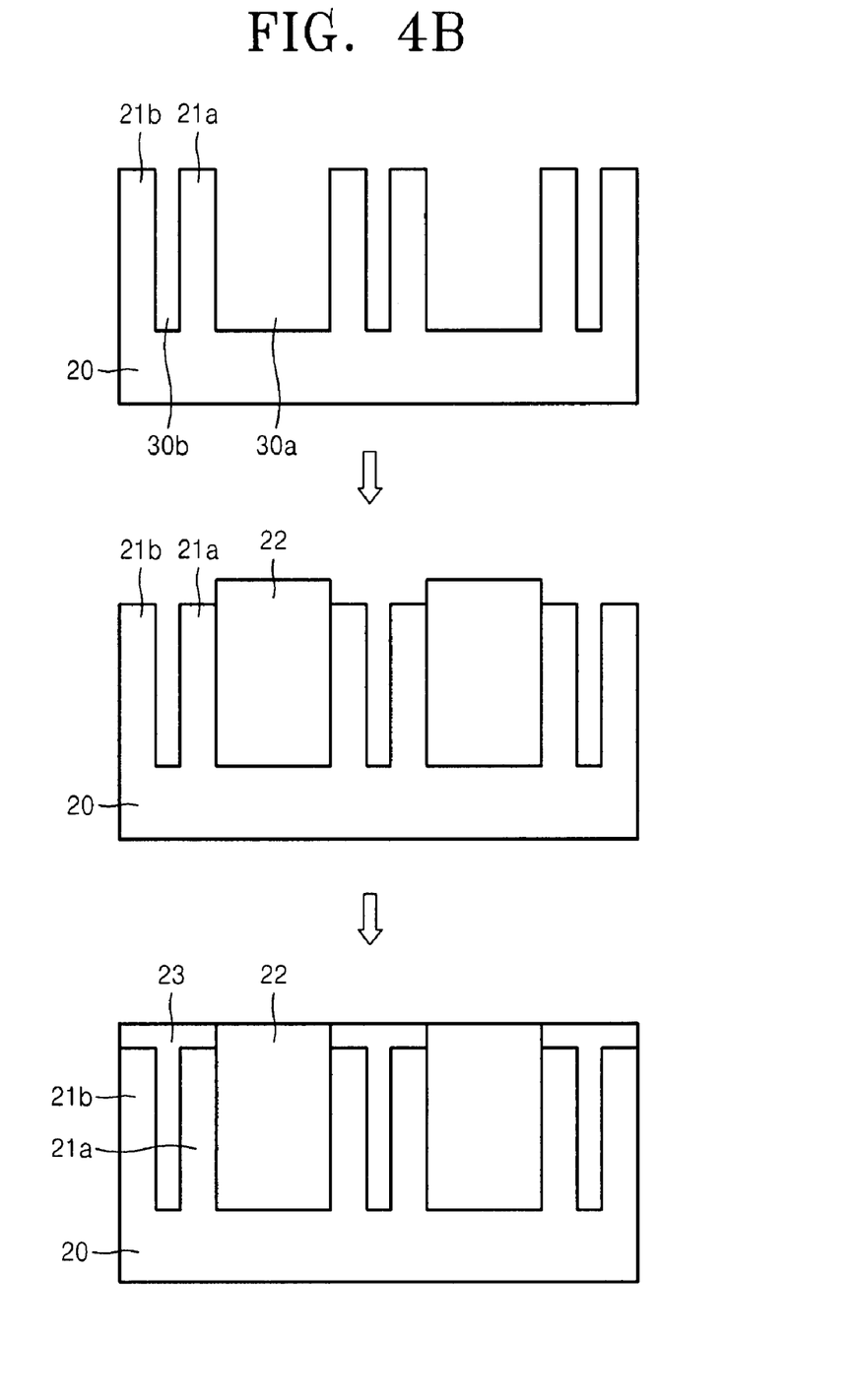
FIG. 4B illustrates a manufacturing process according to an example embodiment of the semiconductor memory device structured as illustrated in FIG. 4A.

FIG. 4B illustrates a manufacturing process according to an example embodiment of the semiconductor memory device structured as illustrated in FIG. 4A. Referring to FIG. 4B, the first and second fins 21a and 21b may be manufactured using a conventional method. For example, first and second trenches 30a and 30b may be formed using photolithography and/or etching technology in a substrate, for example an Si substrate, excluding a portion for the first and second fins 21a and 21b. The fins 21 and 21b may be formed. The first insulating layers 22 filling the first and second trenches 30a and 30b may be formed. The first insulating layers 22 may be formed by coating and/or covering the first and second trenches 30a and 30b with a silicon oxide and planarizing the first and second trenches 30a and 30b. Insulating material filling the second trenches 30b may be etched and removed from the second trenches 30b. The second insulating layers 23 filling the second trenches 30b may be formed and the second insulating layers 23 may be planarized. For example, after the second insulating layers 23 filling the second trenches 30b may be formed, the second insulating layers 23 may be planarized. The second insulating layers 23 may be formed of, for example, a silicon oxide. The second trenches 30b may be filled and impurities may be injected into the exposed upper and/or inner side surfaces of the first and second fins 21a and 21b to form sources and drains. For example, before the second trenches 30b may be filled, impurities may be injected into the exposed upper and/or inner side surfaces of the first and second fins 21a and 21b to form sources and drains.

Figure 3B:
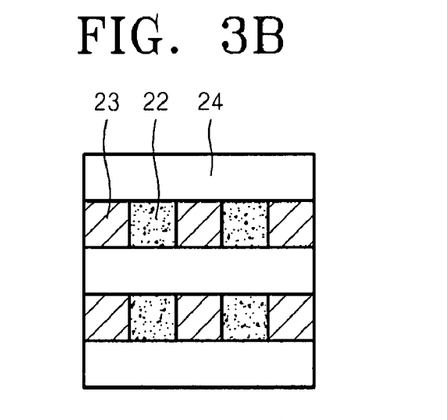
Figure 3C:
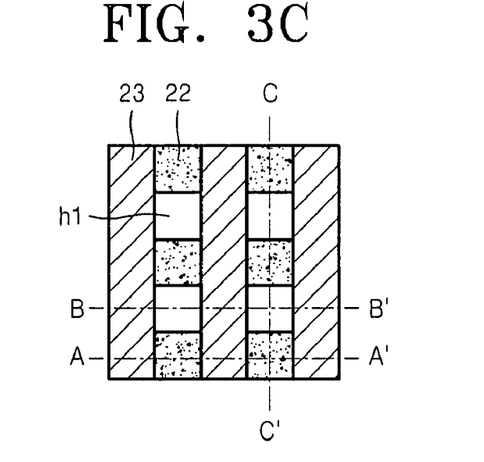

Referring to FIG. 3B, photoresist (PR) layers 24 patterned in a second direction in which the first insulating layers 22 and the second insulating layers 23 cross one another may be formed. Referring to FIG. 3C, exposed portions of the first insulating layers 22 may be etched to form holes (h1). The PR layers 24 may be removed.

Figure 5A:
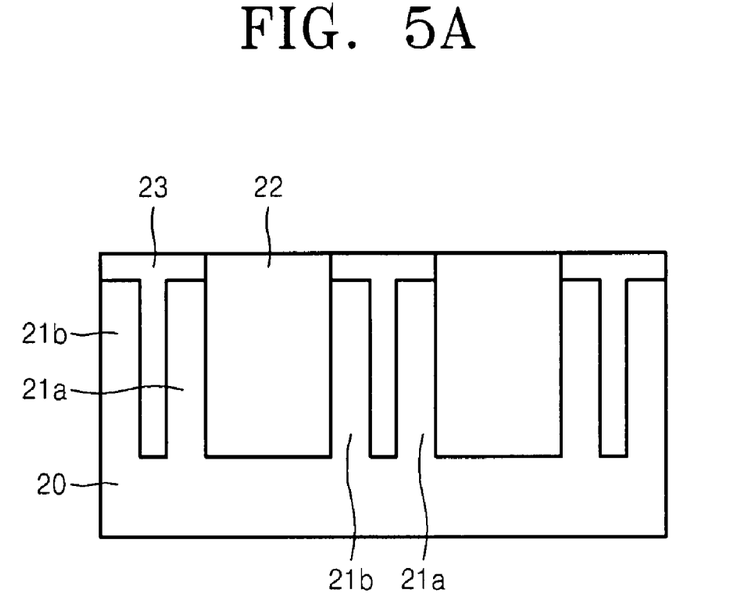
FIG. 5A is a cross-sectional view of the semiconductor memory device taken along a line A-A' of FIG. 3C.
Figure 5B:
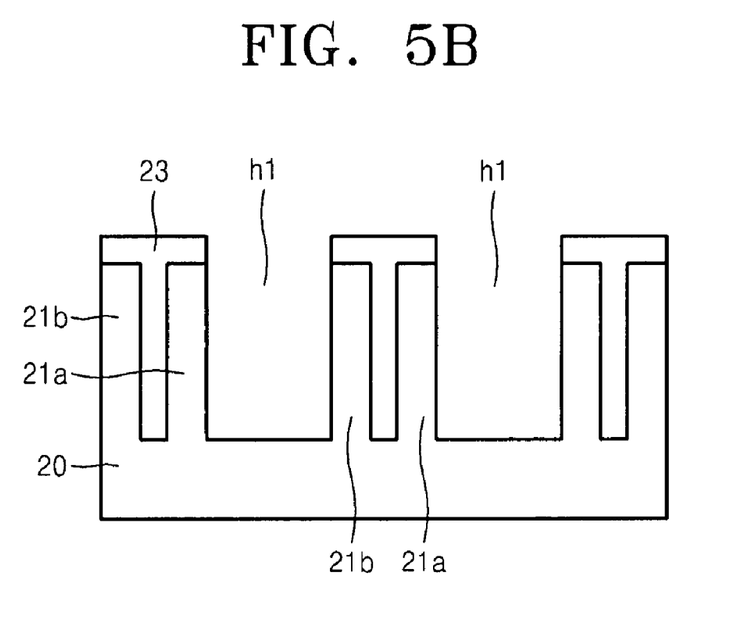
FIG. 5B is a cross-sectional view of the semiconductor memory device taken along a line B-B' of FIG. 3C.
Figure 5C:
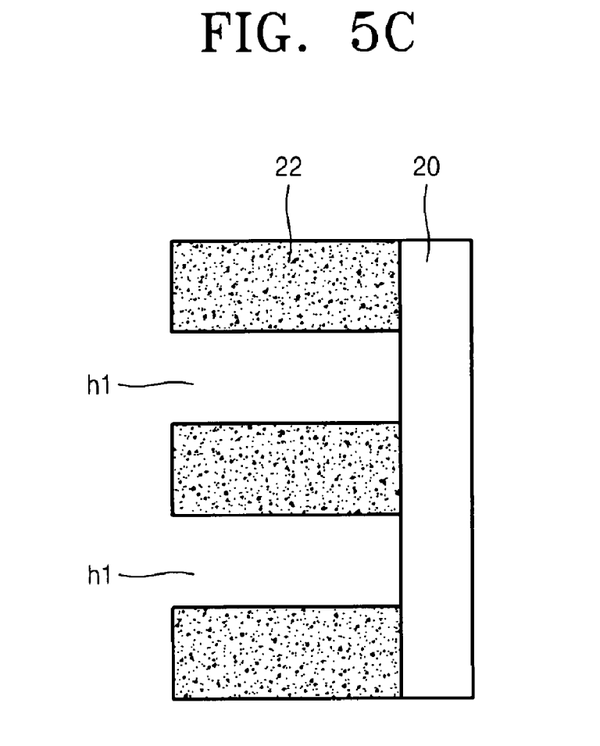
FIG. 5C is a cross-sectional view of the semiconductor memory device taken along a line C-C' of FIG. 3C.

FIG. 5A is a cross-sectional view of the semiconductor memory device of an example embodiment taken along a line A-A' of FIG. 3C. Referring to the line A-A' of FIG. 3C, the first insulating layers 22 may not yet be etched after the PR layers 24 may be formed. FIG. 5B is a cross-sectional view of the semiconductor memory device taken along a line B-B' of FIG. 3C. Referring to FIG. 5B, because portions of the first insulating layers 22 between the PR layers 24 may be etched and removed, holes h1 may be formed between the first and second fins 21a and 21b, respectively. FIG. 5C is a cross-sectional view of the semiconductor memory device taken along a line C-C' of FIG. 3C. Referring to FIG. 5C, the holes h1 may be formed between non-etched portions of the first insulating layers 22.

An oxidization process, for example, a thermal oxidization process, may be performed within the holes h1 illustrated in FIG. 5B. The widths of the first and second fins 21a and 21b on side surfaces of the holes h1 may be reduced due to, for example, a silicon oxide formed after the oxidization process. Accordingly, referring to FIG. 3D, the widths of the first and second fins 21a and 21b and the second insulating layers 23 in regions where the holes h1 may be formed may be reduced. In the regions where the widths of the second insulating layers 23 may be reduced, oxides 25 may be formed, for example oxides 25 may be formed after the first and second fins 21a and 21b on the side surfaces of the holes h1 illustrated in FIG. 5B may be oxidized.

Figure 3D:
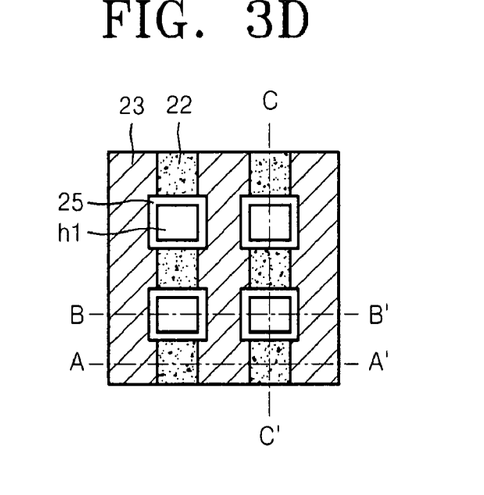
Figure 6A:
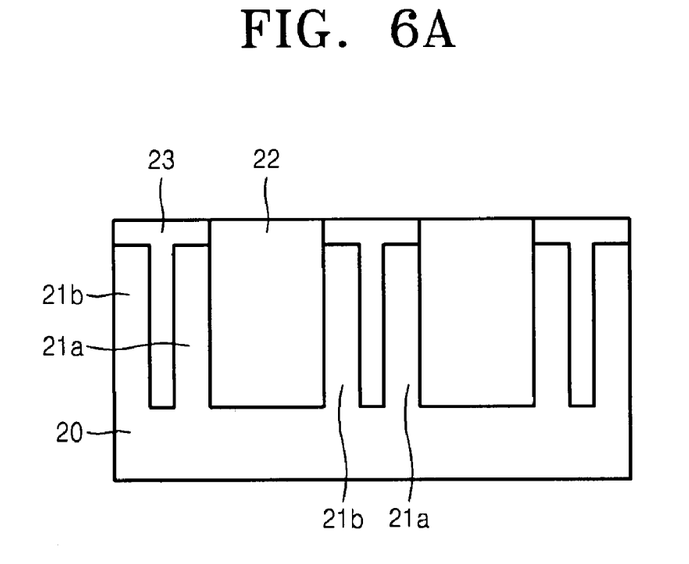
FIG. 6A is a cross-sectional view of the semiconductor memory device taken along a line A-A' of FIG. 3D.
Figure 6B:
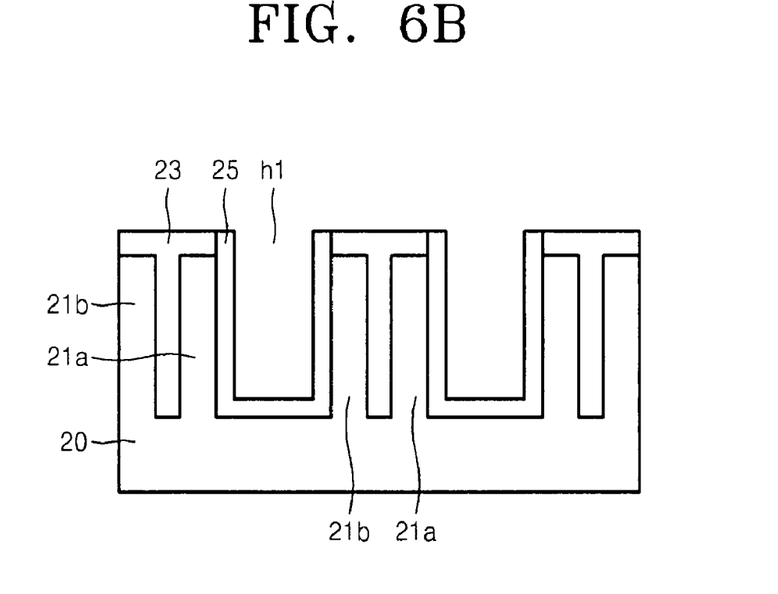
FIG. 6B is a cross-sectional view of the semiconductor memory device taken along a line B-B' of FIG. 3D.
Figure 6C:
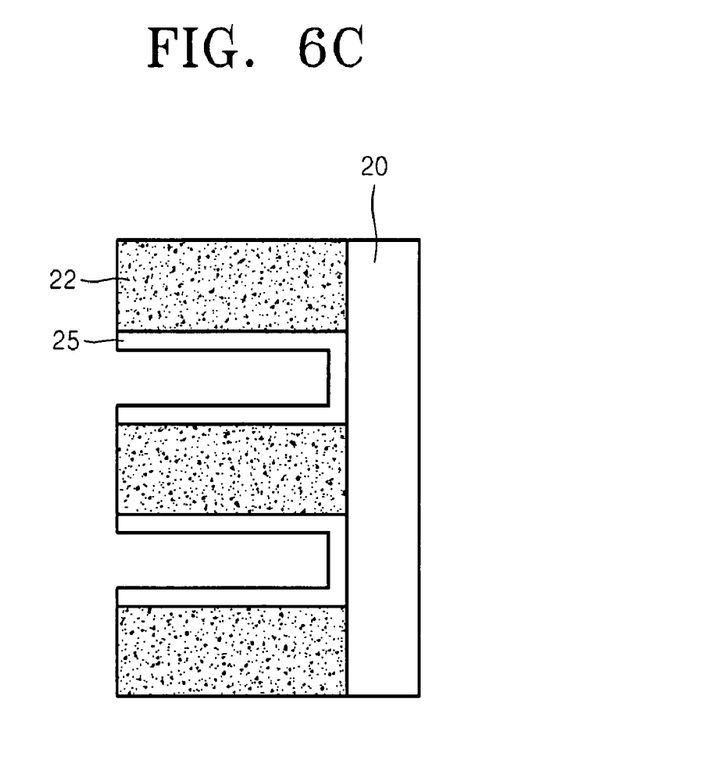
FIG. 6C is a cross-sectional view of the semiconductor memory device taken along a line C-C' of FIG. 3D.

FIG. 6A is a cross-sectional view of the semiconductor memory device taken along a line A-A' of FIG. 3D. Referring to FIG. 6A, the first insulating layers 22 may remain. FIG. 6B is a cross-sectional view of the semiconductor memory device taken along a line B-B' of FIG. 3D. Referring to FIG. 6B, side surfaces of the first and second fins 21a and 21b may be etched, and the widths of first and second fins 21a and 21b may be reduced. The oxides 25 may be formed on the side surfaces of the first and second fins 21a and 21b and/or on the semiconductor substrate 21. FIG. 6C is a cross-sectional view of the semiconductor memory device taken along a line C-C' of FIG. 3D. Referring to FIG. 6C, the first insulating layers 22 may be patterned on the semiconductor substrate 20. The oxides 25 may be formed on side surfaces of the first insulating layers 22 and/or portions of the semiconductor substrate 21 between the first insulating layers 22. For example, the oxides 25 and the first insulating layers 22 may be formed of an identical material, for example, a silicon oxide. Hereinafter, the oxides 25 and the first insulating layers 22 will be indicated by an identical reference numeral.

Figure 3E:
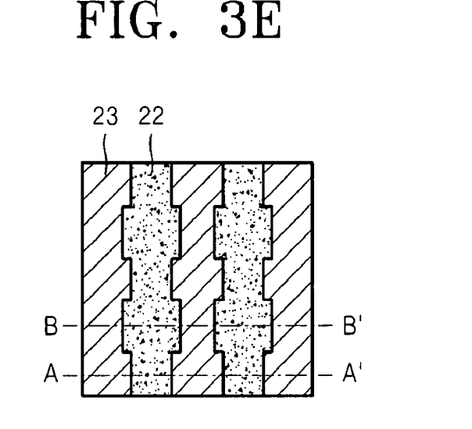
Figure 7A:
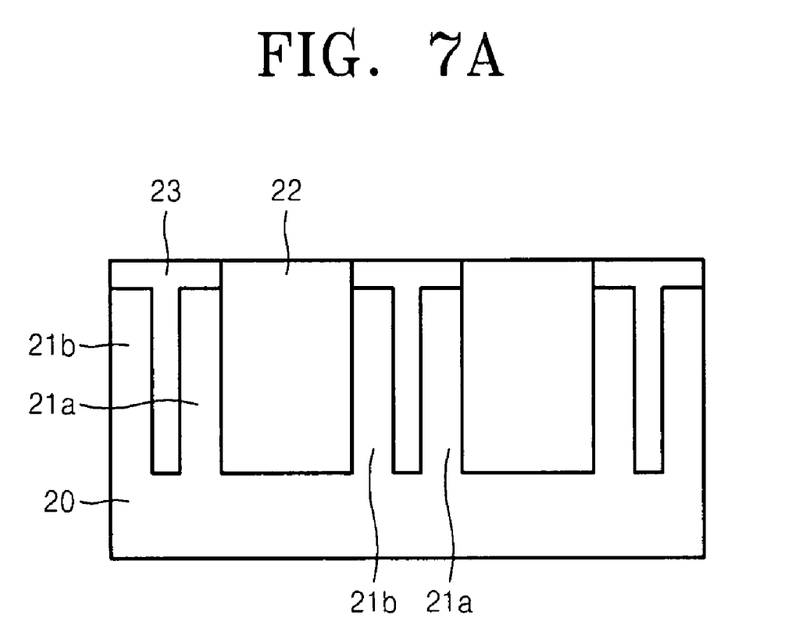
FIG. 7A is a cross-sectional view of the semiconductor memory device taken along a line A-A' of FIG. 3E.
Figure 7B:
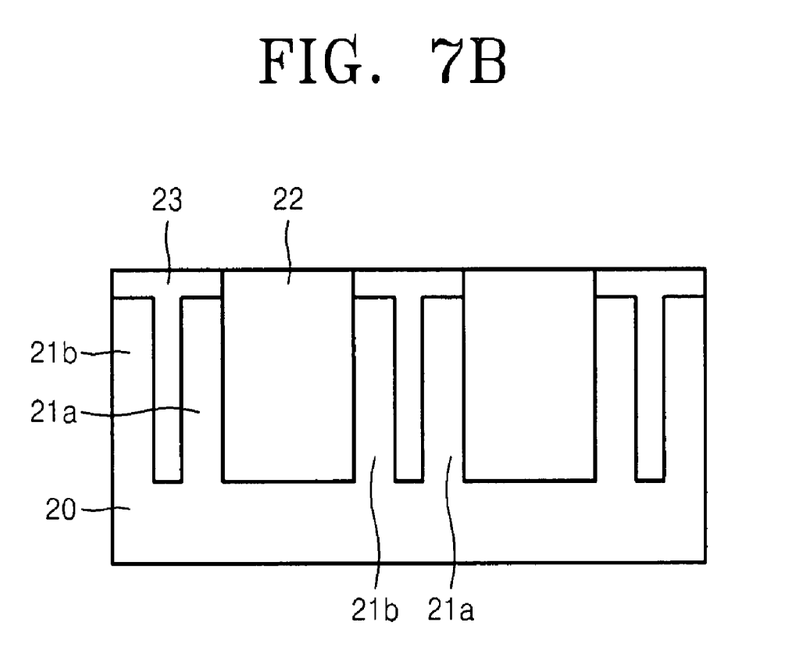
FIG. 7B is a cross-sectional view of the semiconductor memory device taken along a line B-B' of FIG. 3E.

Referring to FIG. 3E, the holes h1 illustrated in FIG. 3D may be filled up with oxides and the oxides may be planarized in, for example, using a chemical mechanical planarization (CMP) process. For example, after the holes h1 illustrated in FIG. 3D may be filled up with oxides, the oxides may be planarized in, for example, using a chemical mechanical planarization process. FIG. 7A is a cross-sectional view of the semiconductor memory device taken along a line A-A' of FIG. 3E. Referring to FIG. 7A, the first insulating layers 22 may remain. FIG. 7B is a cross-sectional view of the semiconductor memory device taken along a line B-B' of FIG. 3E.

Referring to FIG. 7B, the first insulating layers 22 may be in portions of the semiconductor substrate 20 between the first and second fins 21a and 21b with reduced widths.

Figure 3F:
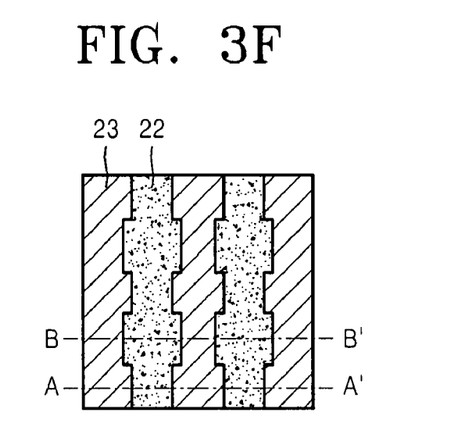
Figure 8A:
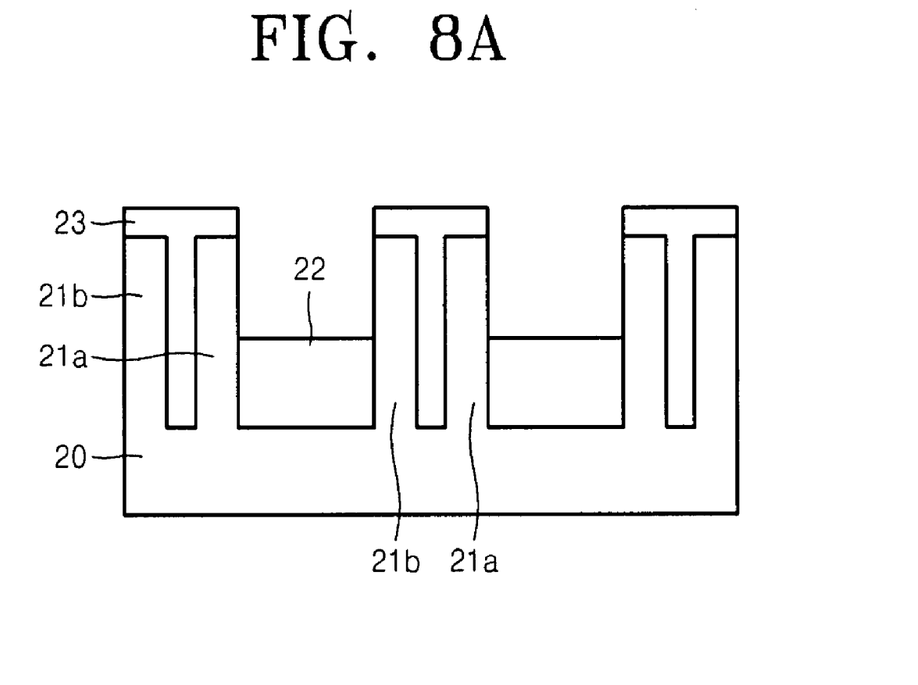
FIG. 8A is a cross-sectional view of the semiconductor memory device taken along a line A-A' of FIG. 3F.
Figure 8B:
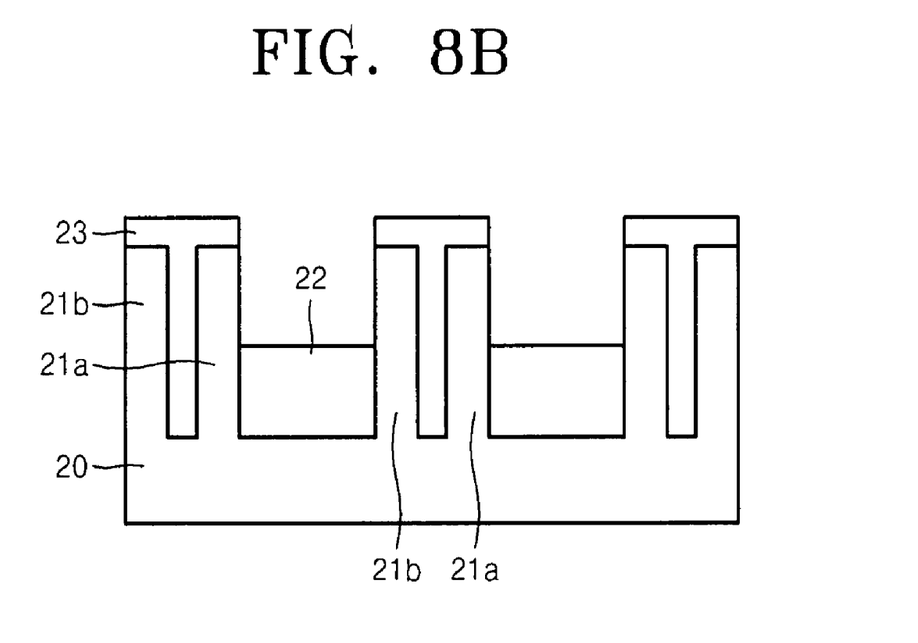
FIG. 8B is a cross-sectional view of the semiconductor memory device taken along a line B-B' of FIG. 3F.

Referring to FIG. 3F, the first insulating layers 22 may be selectively etched to a desired or predetermined depth. For example, the remaining first insulating layers 22 may function as device isolation layers. FIG. 8A is a cross-sectional view of the semiconductor memory device taken along a line A-A' of FIG. 3F. Referring to FIG. 8A, the first insulating layers 22 may be etched to a desired or predetermined depth. FIG. 8B is a cross-sectional view of the semiconductor memory device taken along a line B-B' of FIG. 3F. Referring to FIG. 8B, the first insulating layers 22 on the portions of the semiconductor substrate 21 between the first and second fins 21a and 21b with reduced widths may be etched to a desired or predetermined depth.

Figure 3G:
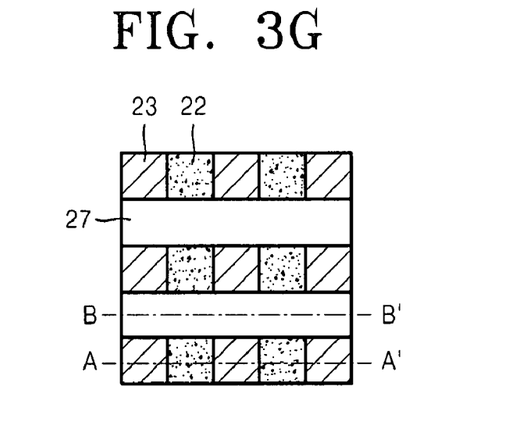
Figure 9A:
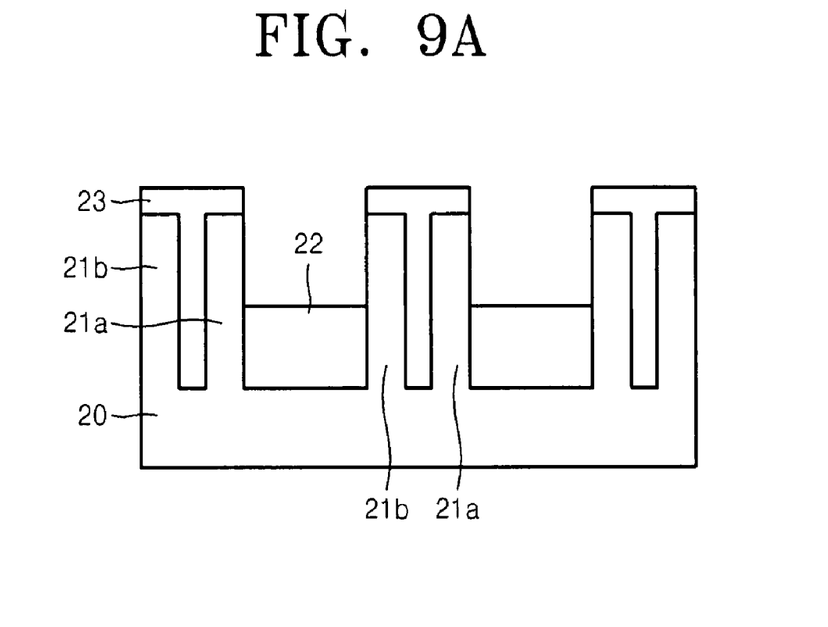
FIG. 9A is a cross-sectional view of the semiconductor memory device taken along a line A-A' of FIG. 3G.
Figure 9B:
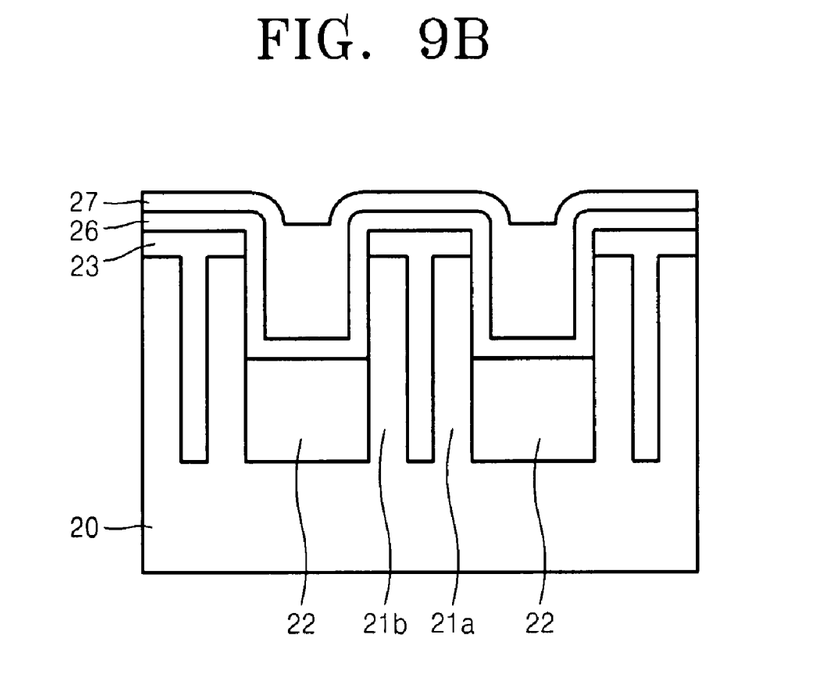
FIG. 9B is a cross-sectional view of the semiconductor memory device taken along a line B-B' of FIG. 3G.

Referring to FIG. 3G, a storage node (not shown) may be formed between the first and second fins 21a and 21b having the etched side surfaces and/or a gate electrode 27 may be formed by coating the storage node 26 with a conductive material. For example, after a storage node may be formed between the first and second fins 21a and 21b having the etched side surfaces, a gate electrode 27 may be formed by coating the storage node 26 with a conductive material. FIG. 9A is a cross-sectional view of the semiconductor memory device taken along a line A-A' of FIG. 3G. Referring to FIG. 9A, because an additional process may not be performed in this region along the line A-A' of FIG. 3G, the first insulating layers 22 may be etched to a desired or predetermined depth. FIG. 9B is a cross-sectional view of the semiconductor memory device taken along a line B-B' of FIG. 3F. Referring to FIG. 9B, the first insulating layers 22 may be formed on portions of the semiconductor substrate 20 between the first and second fins 21a and 21b with reduced widths, and the storage node 26 and/or the gate electrode 27 may be formed on the first insulating layer 22.

The storage node 26 may be selectively formed according to types of memories. For example, in DRAM, the storage node 26 may be formed to have a capacitor structure by coating a dielectric material thereon. In RRAM, a transition metal oxide may be coated on the storage node 26. In PRAM, a phase change material may be coated on the storage node 26. In FeRAM, a ferroelectric material may be coated on the storage node 26. In a SONOS structure, the storage node 26 may have a multi-layer structure composed of an oxide, a nitride, and/or an oxide stacked. For example, in a SONOS structure, the storage node 26 may have a multi-layer structure composed of an oxide, a nitride, and/or an oxide stacked sequentially.

In a semiconductor device according example embodiments, channel regions formed in each pair of fins to correspond to one gate electrode may simultaneously be used as a conductive path for electric charges. Two channels may be simultaneously implemented in one semiconductor device, and two memory nodes may be implemented. An operating current of the semiconductor device may be increased, which may result in an increase in the operating speed of the semiconductor device. Accordingly, the semiconductor device may be used for memories that require higher operating current, for example PRAMs or RRAMs. When the semiconductor device is used for DRAMs, the operating current of the DRAMs may be increased, which may increase a sensing margin.

Although fins in a semiconductor substrate of the semiconductor device may be connected to a body of the semiconductor substrate, the semiconductor substrate may have a structure similar to a SOI structure. Accordingly, the off-current, the junction leakage current, and/or the junction capacitance, which may be generated due to the expansion of a depletion region, may be reduced. A body-bias may be applied to the fins by applying a voltage to the semiconductor substrate. A short channel effect, which may be a problem as the integration density of the semiconductor device increases, may be reduced.

Example embodiments have been particularly shown and described in this specification and figures. For example, a semiconductor device according to example embodiments may include a FinFET and a memory device using the same. A random access memory according to example embodiments may have an NOR-type array structure in which rows and columns of unit cells may be arranged. However, it will be appreciated by those skilled in the art that changes may be made to the illustrated and/or described example embodiments without departing from their principles and spirit, the scope of which is defined by the claims and their equivalents.

What is claimed is:

1. A semiconductor memory device comprising: a substrate; and
  at least one unit memory cell formed on the substrate, the at least one unit memory cell including,
  at least a pair of fins protruding from the substrate and facing each other with a gap between fins of the pair of fins,
  an insulating layer between each pair of fins,
  a storage node on each pair of fins and a surface of a portion of the insulating layer, and
  a gate electrode on the storage node.

2. The semiconductor memory device of claim 1, the at least one unit memory cell further including,
  a pair of channel regions in surfaces of portions of each pair of fins which contact the storage node, and
  a source and a drain in surfaces of each pair of fins on both sides of each of channel region of the pair of channel regions.

3. The semiconductor memory device of claim 2, wherein widths of the fins in the region where the fins and the storage node contact each other are smaller than widths of the fins in a region where the source and the drain are formed.

4. The semiconductor memory device of claim 1, wherein an oxide layer is formed between the substrate and the storage node.

5. The semiconductor memory device of claim 1, wherein the storage node includes polysilicon, silicon-germanium, a metal dot, a silicon dot, or a silicon nitride layer.

6. The semiconductor memory device of claim 1, wherein the storage node includes a dielectric material, a variable resistance material, a phase change material, or a ferroelectric material.

7. The semiconductor memory device of claim 1, wherein the substrate includes bulk silicon, bulk silicon-germanium, or a silicon or silicon-germanium expitaxial layer on the bulk silicon or bulk silicon-germanium.

8. The semiconductor memory device of claim 1, the at least one unit memory cell further including,
  another insulating layer between the fins of each pair of fins.

* * * * *